United States Patent [19]

Kaplinsky

[11] Patent Number: 5,250,859

[45] Date of Patent: Oct. 5, 1993

[54] LOW POWER MULTIFUNCTION LOGIC ARRAY

[76] Inventor: Cecil H. Kaplinsky, 140 Melville Ave., Palo Alto, Calif. 94301

[21] Appl. No.: 767,256

[22] Filed: Sep. 27, 1991

[51] Int. Cl.$^5$ .................................... H03K 19/193
[52] U.S. Cl. .................................. 307/465; 307/468; 365/189.08
[58] Field of Search ............... 307/465, 465.1, 466.9; 365/189.08

[56] References Cited

U.S. PATENT DOCUMENTS

| | | | |
|---|---|---|---|
| 4,032,894 | 6/1977 | Williams | 340/166 R |
| 4,124,899 | 11/1978 | Birkner et al. | 364/716 |
| 4,195,352 | 3/1980 | Tu et al. | 364/900 |
| 4,609,986 | 9/1986 | Hartmann et al. | 364/200 |
| 4,661,922 | 4/1987 | Theirbach | 307/465 |
| 4,758,746 | 7/1988 | Birkner et al. | 307/465 |
| 4,796,229 | 1/1989 | Greer | 307/465 |
| 4,847,612 | 7/1989 | Kaplinsky | 340/825.8 |
| 4,906,870 | 3/1990 | Gongwer | 307/465 |
| 4,942,319 | 7/1990 | Pickett et al. | 307/465 |
| 4,963,768 | 10/1990 | Agrawal et al. | 307/465 |
| 4,975,601 | 12/1990 | Steele | 307/465 |
| 5,028,821 | 7/1991 | Kaplinsky | 307/465 |
| 5,055,712 | 10/1991 | Hawley | 307/465 |
| 5,105,388 | 4/1992 | Itano | 307/465 |
| 5,155,389 | 10/1992 | Furtek | 307/465.1 |

Primary Examiner—Edward P. Westin
Assistant Examiner—Andrew Sanders
Attorney, Agent, or Firm—Schneck & McHugh

[57] ABSTRACT

A low power logic array and a programmable logic device made up of two successive logic arrays, at least one of which being a low power array, in which the programmable elements in the array are multibit memory elements. Logic gates combine the outputs of corresponding memory elements. The logic array includes a set of array inputs which may be arranged in groups connecting to decoder inputs. Decoder outputs provide an address signal to address inputs of the memory elements. In a preferred embodiment, the memory elements are arranged in a matrix of rows and columns with each row connected to a decoder and each column coupling to one or more logic gates. The logic gates may be AND, OR, NAND or NOR gates, and may be arranged in a hierarchy of successive stages of logic gates.

38 Claims, 9 Drawing Sheets

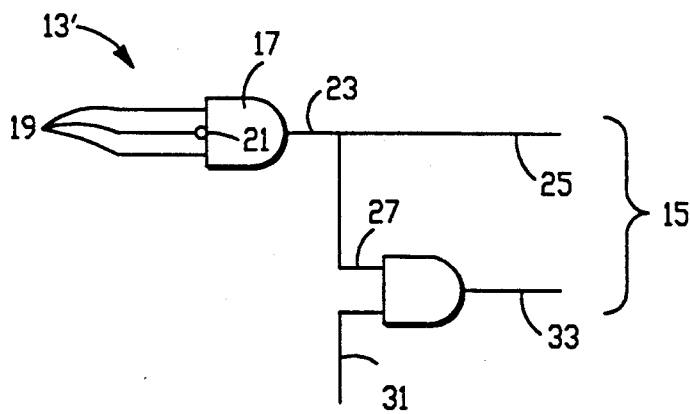
FIG.-5
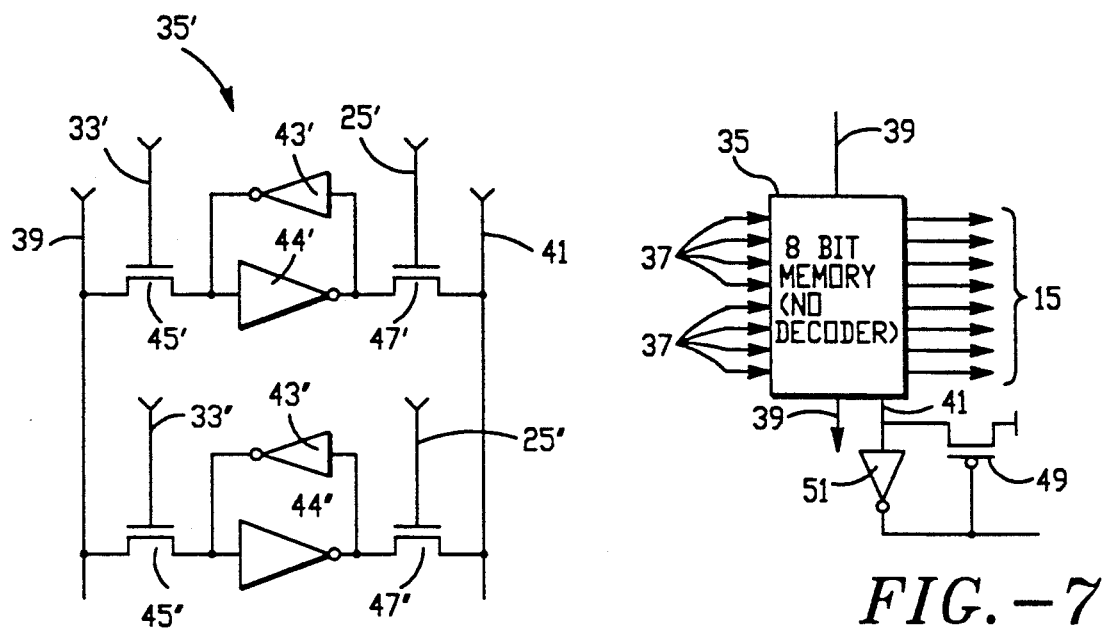
FIG.-6
FIG.-7
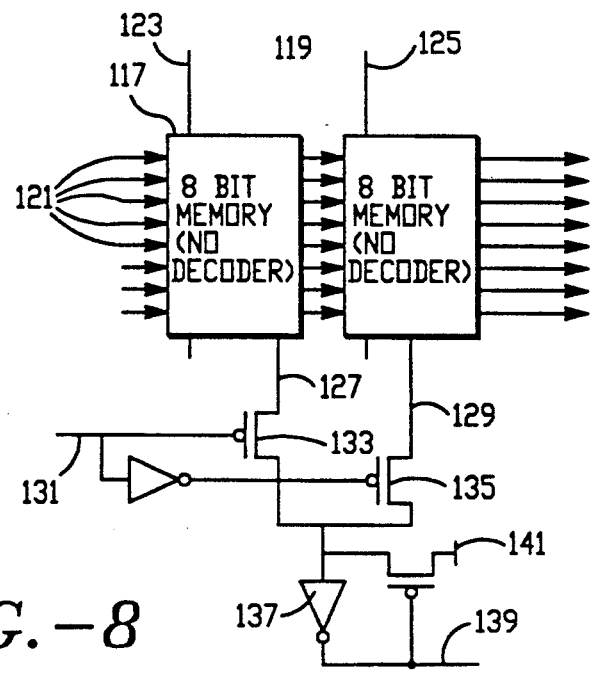
FIG.-8

LOW POWER MULTIFUNCTION LOGIC ARRAY

DESCRIPTION

Technical Field

The present invention relates to multifunctional and programmable digital logic integrated circuit devices.

Background Art

Programmable logic devices (PLDs) form a well-known class of integrated circuits, including devices known as PALs and PLAs, which are used to provide the "glue" or logic for many electronic systems. U.S. Pat. Nos. 4,032,894; 4,124,899; 4,195,352; 4,609,986; 4,758,746; 4,847,612; 4,906,870; 4,942,319; and 4,963,768 exemplify the diversity of available PLD architectures, while illustrating the trade-offs that have been made between size, speed, power consumption and functional flexibility.

One element or component common to most PLDs is the programmable AND array. These AND arrays are generally constructed with two sets of intersecting conductive lines, referred to as input lines and product term lines, respectively. At the intersections or crossing points of input lines with product term lines are programmable switches in the form of fuses, EPROMs or EEPROMs. These switches connect selected input lines to selected product term lines. Usually the array is constructed so that the voltage on a product term line is pulled high, unless it is connected to an input line that happens to be in a low voltage state, in which case it is pulled low. A sense amplifier on an end of the product term line senses the voltage state of the line.

Power consumption in PLDs constructed with CMOS technology is made up of two components, one a continuous power consumption by the sense amplifiers which is independent of the use of the PLD (DC power), and the other, power which is only dissipated when a voltage is changing from low to high or high to low (AC power) AC power is used, not only by active gate elements, such as CMOS inverters on the input lines, and sense amplifiers, but most especially by the conductive lines themselves in the very act of charging or discharging the lines to bring them to a new voltage level Power used by the conductive lines is proportional to $CV^2f$, where C is the line capacitance, V is the voltage change from one state to the other, and f is the clock frequency In conventional AND array construction, with its many long conductive lines potentially switching at once, power consumption increases with the size, speed or functional flexibility of the device. Devices with programmable, rather than fixed, OR array constructions must make similar tradeoffs.

It is an object of the invention to provide a logic array architecture with lower power consumption.

It is another object of the invention to provide a programmable logic device (PLD) having a pair of logic arrays, outputs of one being connected to inputs of the other, where at least one of these arrays is programmable, which PLD is characterized by low power consumption.

DISCLOSURE OF INVENTION

These objects are met with a logic array architecture which replaces the two crossing sets of many long conductive lines, and their interconnecting switches and sense amplifiers with an arrangement of plural multibit memory elements, each having address inputs coupled to inputs of the array, and plural logic gates having inputs coupled to memory outputs. Outputs of the logic gates are coupled to outputs of the array. The memory elements are programmable by loading them with data bits, such that a specified bit is provided in a memory element's output in response to input signals received on its address inputs.

In one configuration, the inputs are organized in groups connected to decoder inputs of a set of decoders. Decoder outputs provide address signals to address inputs of the memory elements in accord with the combination of input signals received on the decoder inputs. The memory elements may be arranged in a matrix of rows and columns with each row of memory elements connected to a single decoder. Each logic gate would then be connected to only memory outputs from a single column of memory elements. Several stages of logic gates may be provided, with each gate of a first stage connected directly to a subset of memory elements in a column and each gate of a second stage connected to the outputs of the first stage of logic gates corresponding to a single column of memory elements. Logic gates may be AND, OR, NAND, NOR, XOR or XNOR gates. Programmable XOR gates may be provided on the outputs to provide selected inversion or noninversion of the output signals of the array. The arrays can have storage elements, such as registers or latches, at their inputs or outputs, or between memory outputs and logic gate inputs.

The logic array architecture may be used in a programmable logic device which is made up of two successive logic arrays, at least one of which is programmable. For example, the first array may be a programmable AND array built according to the low power architecture of the invention, and the second can be either a fixed array of OR gates or a programmable OR array. The programmable OR array can also be built according to the low power architecture of the invention. The outputs of the second array can feed back to inputs of the first or second array. At least some inputs to the second array can also be received from a source independent from the first array. Other arrangements are possible.

DESCRIPTION OF THE DRAWINGS

FIG. 5 is a logic gate diagram of a portion of a decoder used in the logic array of FIGS. 1a and 1b and PLDs of FIGS. 2–4.

FIG. 6 is a logic gate diagram of two memory cells of a multibit memory element used in the logic array and PLDs of FIGS. 1–4.

FIG. 7 is a block diagram of a multibit memory element used in the logic array and PLDs of FIGS. 1–4 and having a single 8-bit memory without decoder and a pull-up component.

FIG. 8 is a block diagram of an alternative multibit memory element to that of FIG. 7 having two 8-bit memories without decoder, memory select means and a pull-up component.

BEST MODE FOR CARRYING OUT THE INVENTION

Figure 1A:
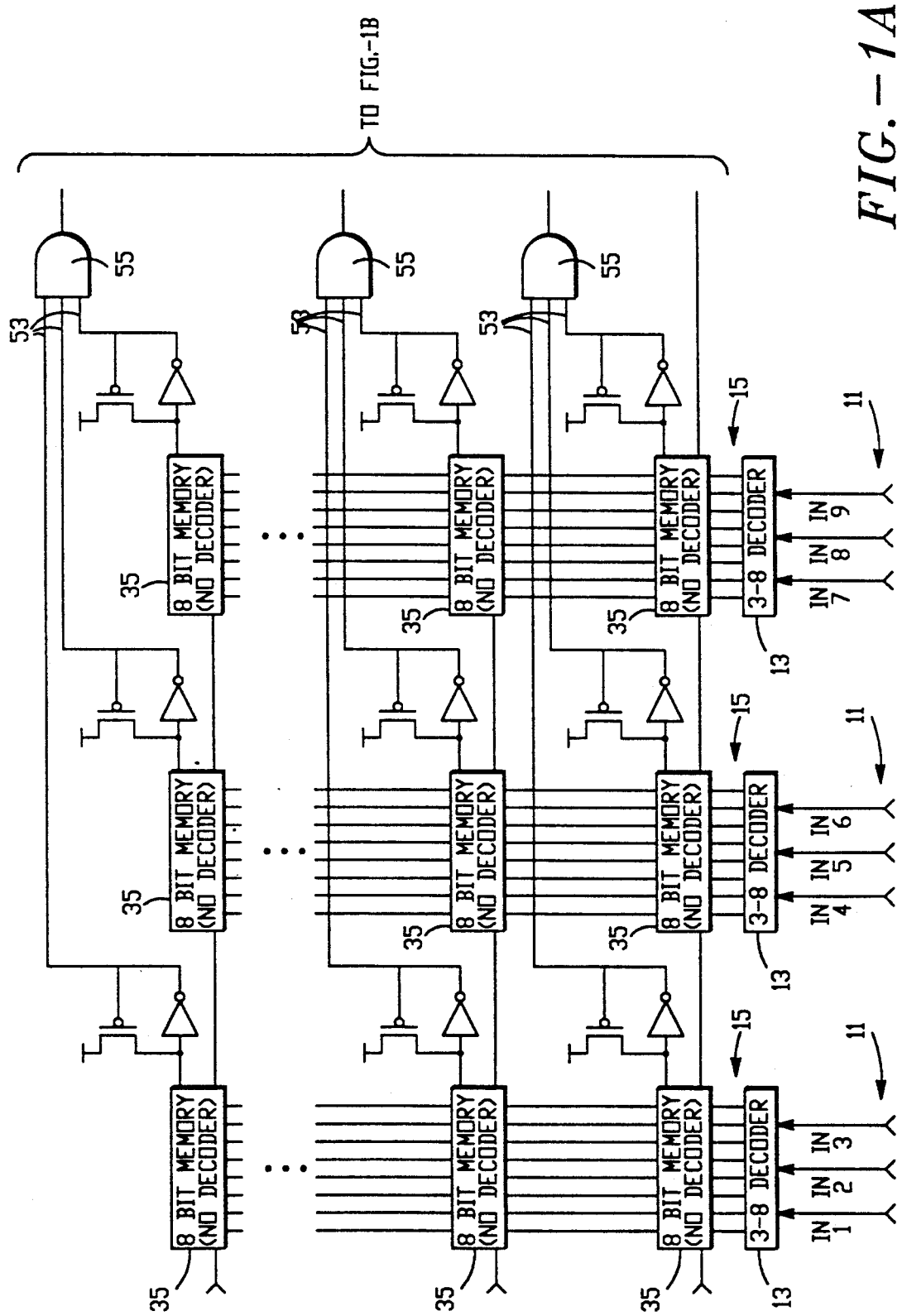
FIGS. 1a and 1b together form a schematic block diagram of a logic array of the present invention.
Figure 1B:
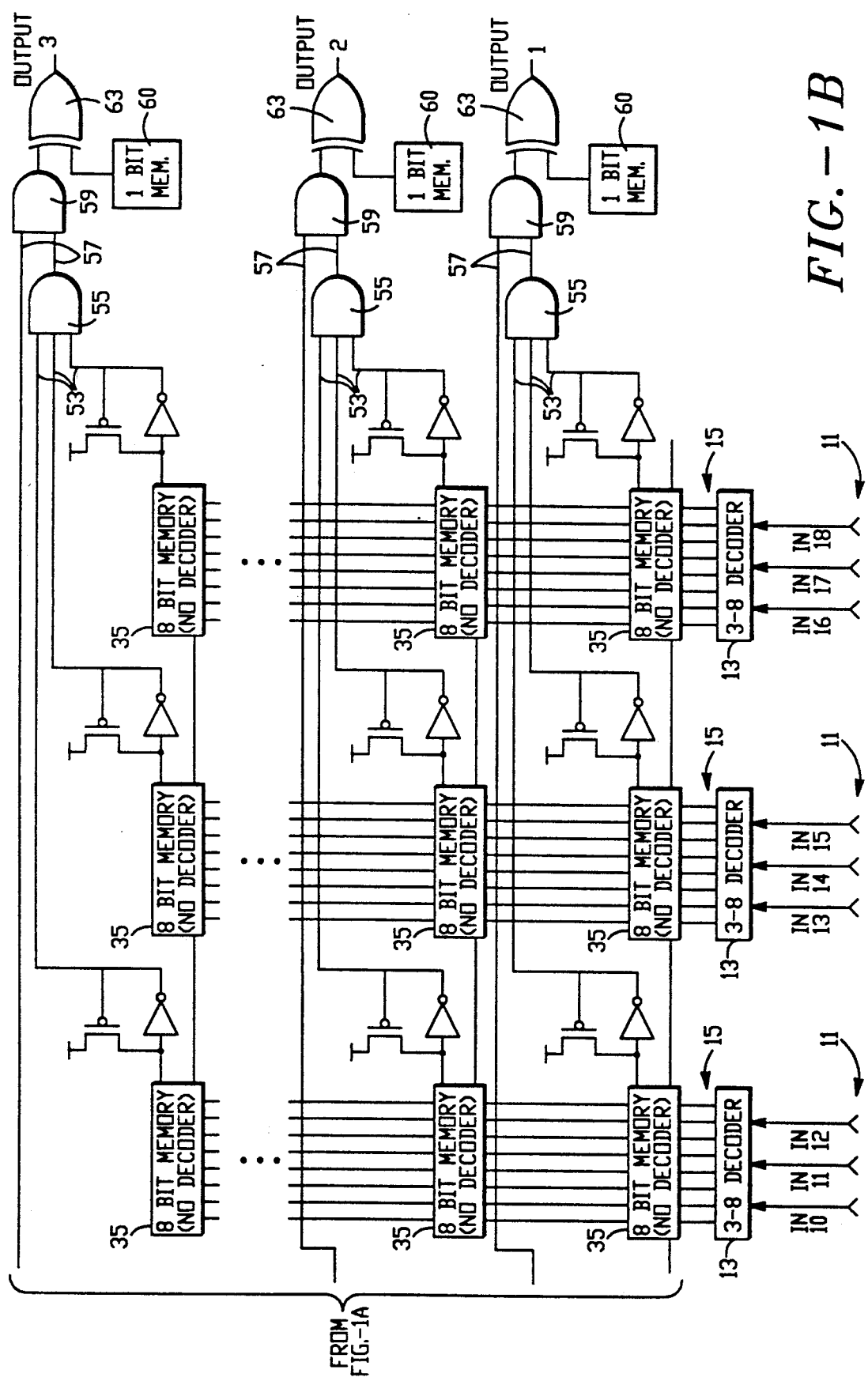

With reference to FIGS. 1a and 1b, a logic array of the present invention includes a set of array inputs 11, here organized into groups of three. The array inputs 11 are connected to a set of decoders 13. Each of the decoders 13 has J inputs, where in this instance J=3, connected to the corresponding groups of array inputs 11. Each of the decoders 13 also has up to $2^J$ outputs 15. In the present instance, each decoder 13 has eight outputs. As will be seen, each decoder output 15 may actually consist of two conductive lines, called word lines, one for reading and the other for writing operation.

A detail of a portion 13' of a decoder 13 is seen in FIG. 5. In general, a decoder 13 will have as many portions like portion 13' as it has outputs 15. Thus, in an eight output decoder 13 there would be eight portions constructed in a manner similar to the portion 13' shown. Portion 13' includes a logic AND gate 17 with three inputs 19. The number of inputs 19 is the same as the number J of inputs into the entire decoder 13. An inverter 21 may be present at one or more of the inputs 19 to AND gate 17. Each portion 13' of the decoder differs slightly from the others in which of the inputs 19, if any, has an inverter, such that the decoder as a whole has portions with every possible combination of inverted and noninverted inputs. The inputs 19 of each decoder portion 13' are connected to the group of corresponding inputs 11 to the decoder. Depending on the input signals applied to array inputs 11, and consequently to the decoder inputs 19, the output 23 of gate 17 of one of the decoder portions will be high. For example, the decoder portion 13' shown in FIG. 5 will provide a gate output 23 that is high only when the first and third input signals are high and the second input signal is low. The gate output 23 is connected to a read word line 25. A second AND gate 29 has a first input connected to gate output 23 and a second input connected to a write enable line 31. It provides an output to a write word line 33 whenever a write enable signal is applied to write enable line 31.

Returning to FIGS. 1a and 1b, the programmable elements in the logic array are a plurality of multibit memory elements 35. These memory elements 35 may be arranged in a matrix of rows and columns, as shown, with one row per group of inputs 11 with its decoder 13 and with one column per output bit. In such an arrangement, each decoder output 15, corresponding to a group of array inputs 11, traverses an entire row of memory elements 35, rather than simply being connected to just one memory element. As seen in FIG. 7, each memory element has a set of address inputs 37 and an output or read bit line 41. The address inputs 37 are connected to the set of decoder outputs 15, which outputs 15 then continue on to the next memory element 35 in that row. Each memory element 35 also has a write bit input 39 by which data bits may be loaded into the memory element 35 The write bit line 39 may be shared among an entire column of memory elements 35, since programming typically will occur no more than once when the array is turned on and can be done sequentially, bit by bit.

The memory elements 35 can be made of any nonvolatile memory, such as ROMs, EPROMs or EEPROMs, or alternatively can be made of a volatile memory, such as SRAMs, shift registers or latches. Nonvolatile memories are generally loaded only once when the device is first programmed, while volatile memories need to be reloaded each time the power is turned on, i.e. at runtime, since they lose their stored bits whenever the power is turned off. The source of the data bits to be loaded into these volatile memories can be either a nonvolatile memory on the chip or an external source. The source need not be fixed, but could also be selected at run-time, for example, by the state applied to one or more external contacts, such as pins, of the device or by the state of one or more memory cells.

A portion containing two memory cells 35' and 35" of one kind of multibit memory element 35 is shown in FIG. 6. A first memory cell 35' is addressed by a first pair of word lines 25' and 33' from a decoder 13 of the device, while a second memory cell 35" is addressed by a second pair of word lines 25" and 33" from the same decoder 13 of the device. The memory element 35 also includes a write bit line input 39 common to all of the memory cells 35', 35", etc. and a read bit line output 41 also common to all of the memory cells 35', 35", etc. The memory cells 35', 35", etc. in this example are latches made up of pairs of cross-coupled inverters 43' and 44', 43" and 44", etc. A data bit may be written into a memory cell 35' or 35" of the memory element 35 by applying a high logic level address signal to the corresponding write bit line 33' or 33", which activates a pass transistor 45' or 45" controlled by that write bit line, and simultaneously applying the data bit to the common write bit line 39. The data bit will be transferred from the write bit line 39 through the activated pass transistor 45' or 45" to the corresponding inverter pair 43' and 44', or 43" and 44". Reading a memory cell 35' or 35" is done by activating a corresponding pass transistor 47' or 47" by applying a high logic level address signal on the corresponding read word line 25' or 25" from the decoder 13 of the device The selected data bit is then transferred from the corresponding inverter pair 43' and 44' or 43" and 44" through the activated pass transistor 47' or 47" onto the read bit line 41. As seen in FIG. 7, charging of the read bit line 41 is assisted by a pull-up transistor 49. The output of the memory cell 35 on read bit line 41 is typically inverted by an inverter 51. If this is the case, the inversion should be taken into account when programming the memory element 35 with the desired logic.

Returning to FIGS. 1a and 1b, the outputs from memory elements 35 connect to inputs 53 of logic gates 55, here shown as AND gates. In order to minimize the cumulative length of all the conductive lines output from the memory elements 35, the rows of memory cells 35 are here grouped into threes so that each logic gate 55 has three inputs 53 connected to three memory elements 35 in a column of such elements. The outputs 57 of the logic gates 55 are in turn connected to a second stage of logic gates 59, the outputs 57 of each column of logic gates 55 being input into a single corresponding gate 59 of that column. If there are six rows of memory elements 35 grouped into two sets of three rows, each set having a row of first stage logic gates 55, then each of the second stage logic elements 59 will have two inputs 57.

The outputs 61 of the second stage logic gates 59 may connect to a row of programmable inverters in the form of XOR gates 63. A set of one-bit memories 60, such as EPROMs, provide one input to the XOR gates 63, while the outputs 61 provide the other input The outputs of XOR gates 63 form the outputs OUTPUT$_1$, OUTPUT$_2$, ..., OUTPUT$_n$ of the logic array.

Figure 2A:
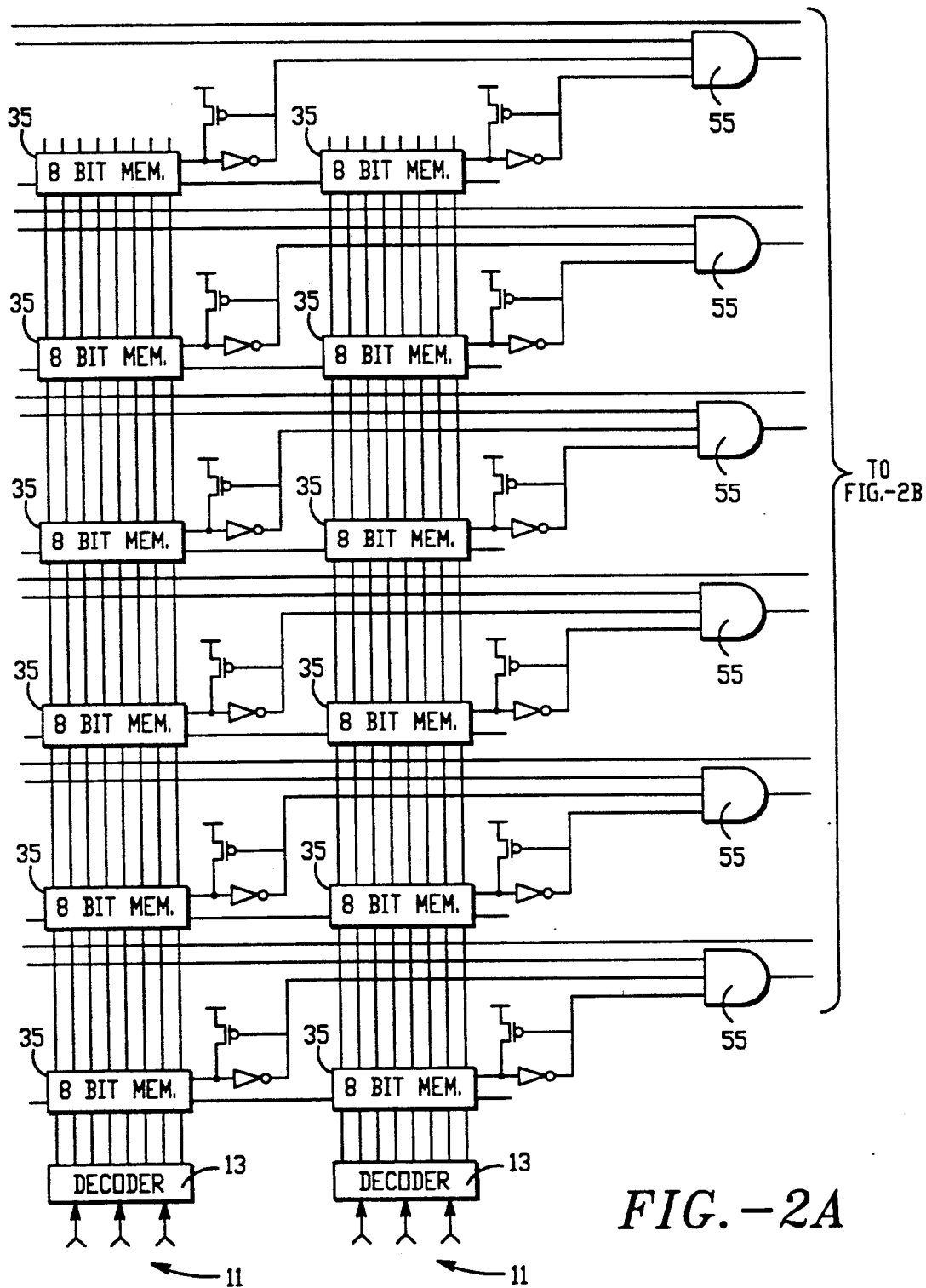
FIGS. 2a and 2b together form a schematic block diagram of a programmable logic device (PLD) of the present invention comprising the logic array of FIGS. 1a and 1b followed by a fixed OR array.
Figure 2B:
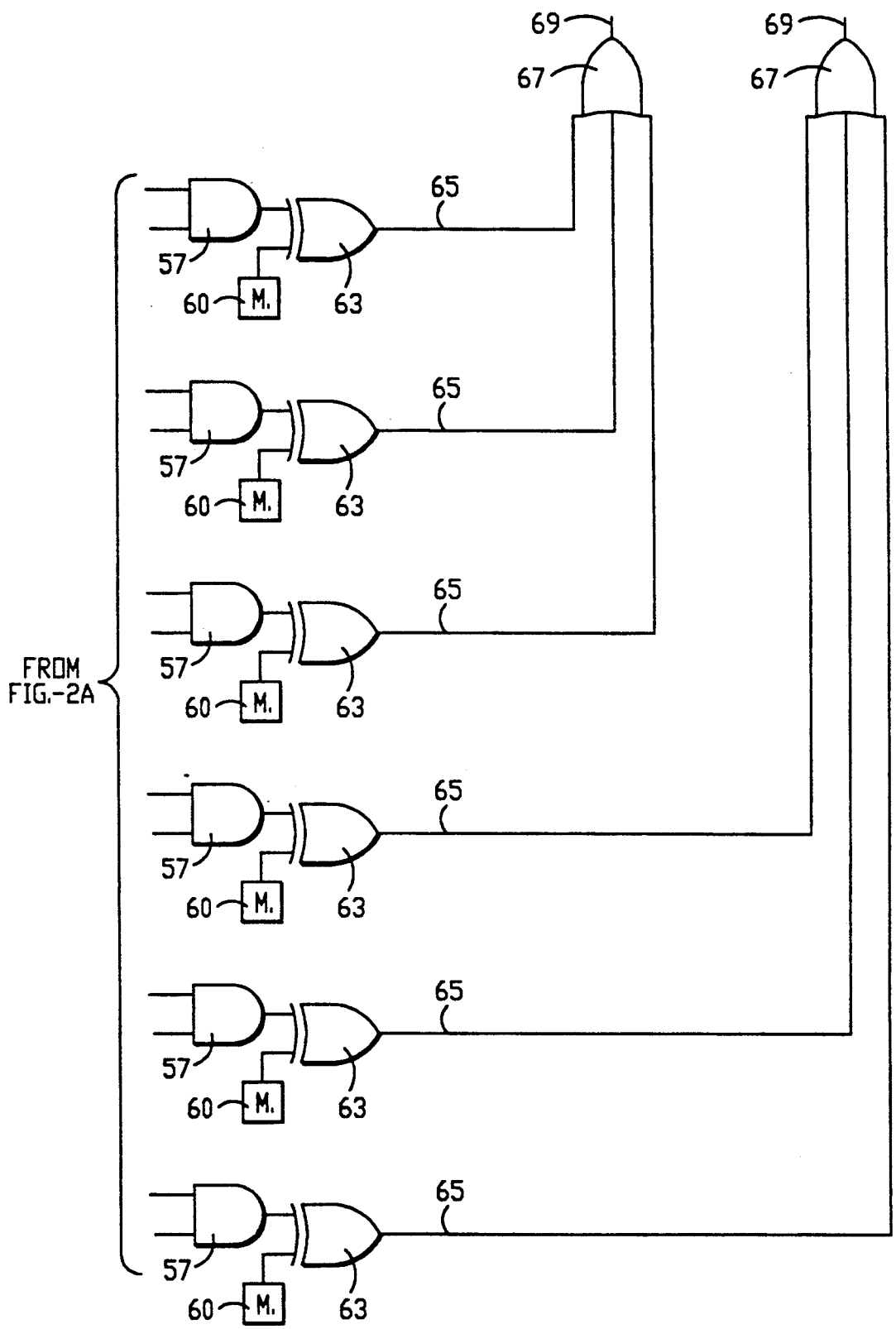

With reference to FIGS. 2a and 2b, a programmable logic device of the present invention comprises two arrays with the outputs 65 of one array feeding into the inputs of the second array. The first array, a portion of which is seen in FIGS. 2a and 2b, is programmable and is constructed exactly like the logic array in FIGS. 1a and 1b, having a plurality of inputs 11 coupled to address inputs of memory elements 35 and having logic gates 55 coupled to the read bit line outputs of memory elements 35. The outputs of logic gates 55 are in turn coupled to the inputs of logic gates 57. A programmable XOR gate 63 connects to the output of each logic gate 57. As in FIGS. 1a and 1b, the logic gates 55 and 57 are shown as AND gates. The second array, seen in FIG. 2b, is a fixed function array, here shown as an array of OR gates 67. The OR gates 67 have inputs 65 connected to the outputs of programmable XOR gates 63 in some specified manner. In the present instance, each OR gate has three inputs connected to three different XOR gates. The OR gate outputs 69 form the outputs of the second array.

Figure 3A:
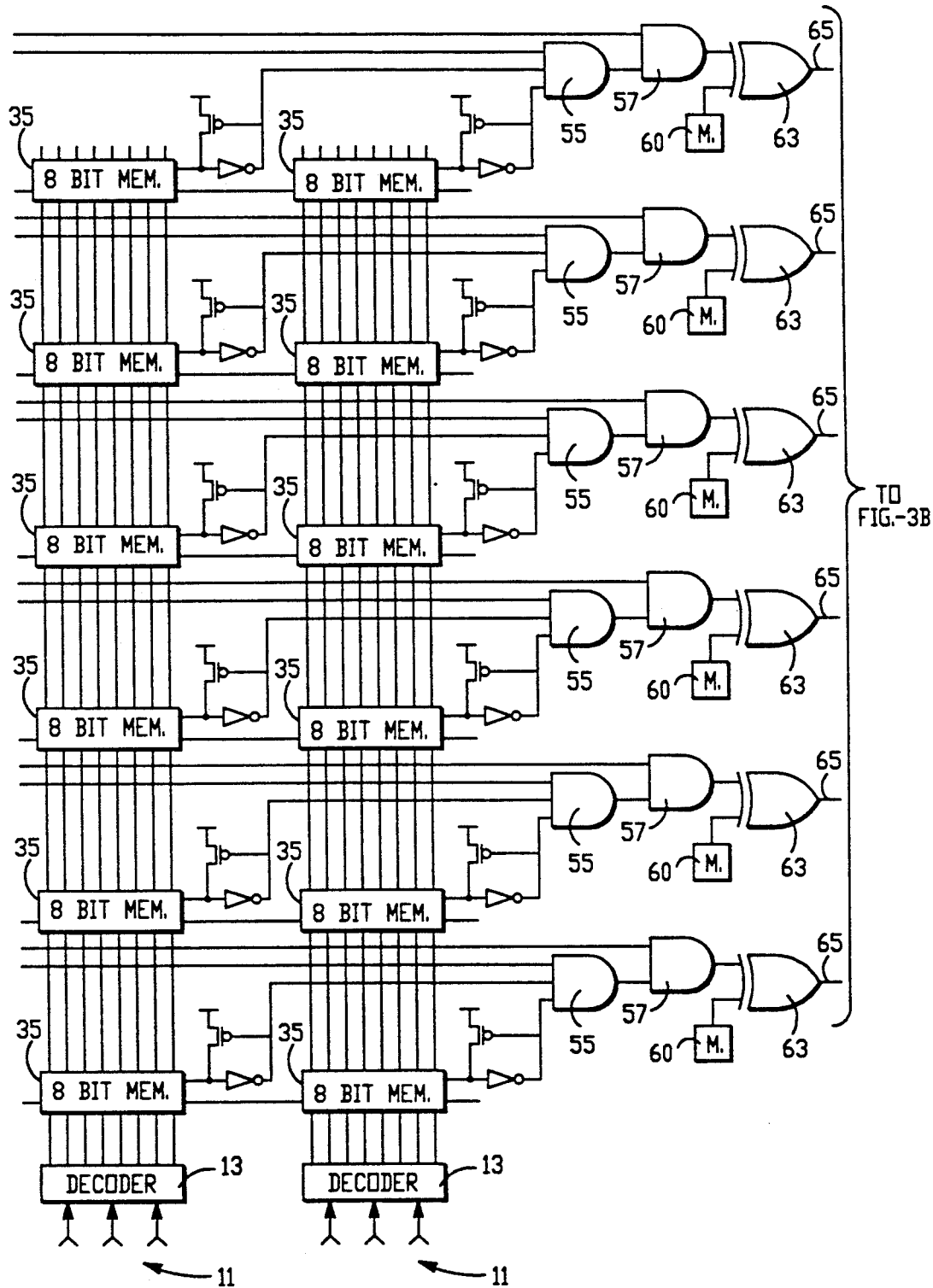
FIGS. 3a and 3b together form a schematic block diagram of a PLD of the present invention comprising the logic array of FIGS. 1a and 1b followed by a programmable OR array of similar construction to the logic array of FIGS. 1a and 1b.
Figure 3B:
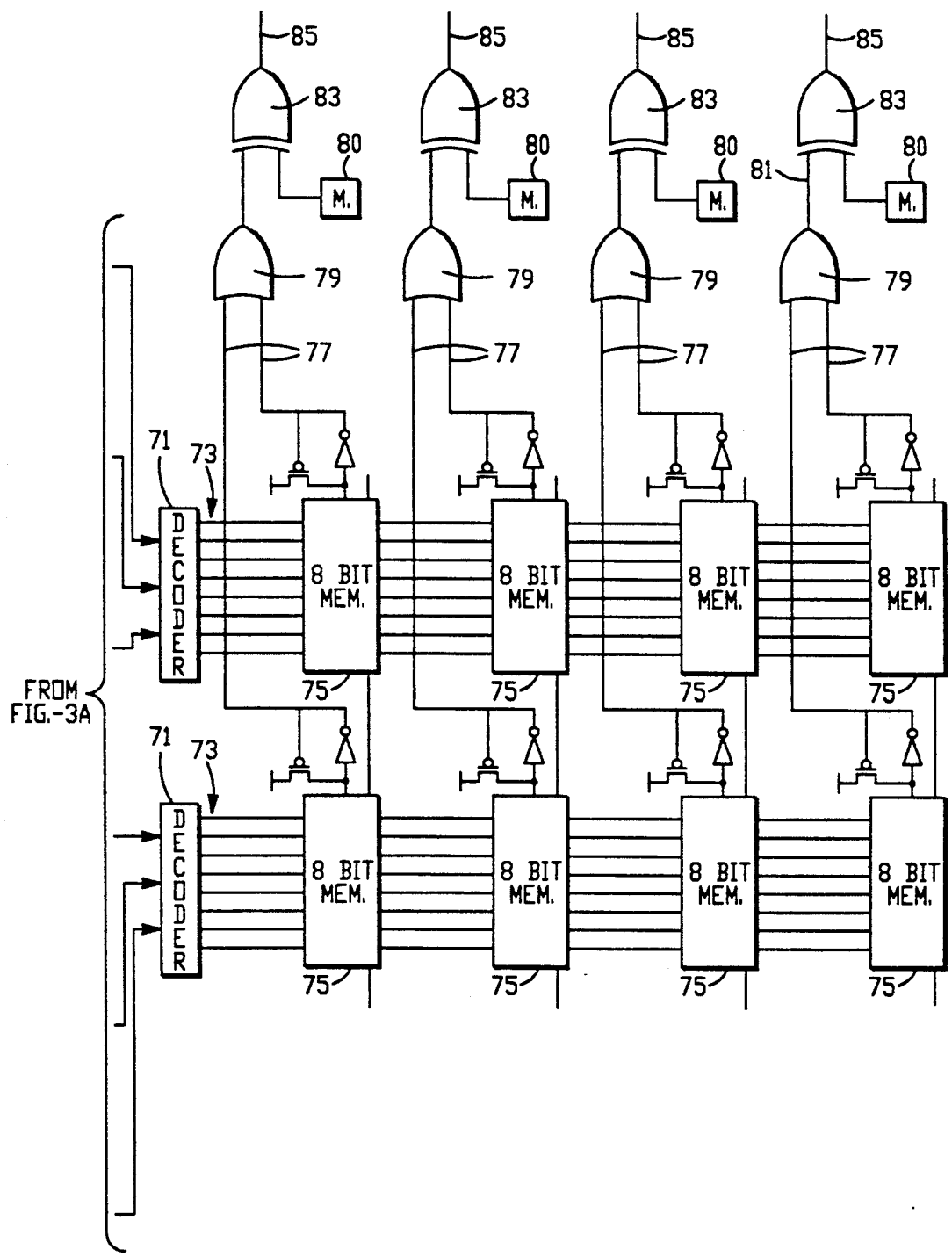

With reference to FIGS. 3a and 3b, another programmable logic device of the present invention also comprises two logic arrays with the outputs 65 of one array feeding into the inputs of the second array. But in this embodiment the second array is programmable like the first array. Both arrays are constructed like the logic array shown in FIGS. 1a and 1b. As before, the first array has a plurality of inputs 11 coupled through a set of decoders to address inputs of a matrix of memory elements 35. Logic AND gates 55 and 57 couple to the read bit line outputs of the memory elements 35. Programmable XOR gates 63 selectively invert or leave uninverted the outputs of AND gates 57. In this embodiment, the second array also has a plurality of inputs 65 which are the outputs of the XOR gates 63. As with the first array, the inputs 65 are grouped in threes with each group being received by a decoder 71. Decoder 71 has N (=3) inputs and up to $2^N$ (=8) outputs 73 and may be constructed as described above with reference to FIG. 5 so as to provide an address signal on one of its outputs 73. The outputs may each consist of two conductive lines, one a read word line and the other a write word line. The second array has a matrix of rows and columns of memory elements 75, each constructed like the memory elements 35 of the first array as in FIGS. 6 and 7. The read bit line outputs 77 of the memory elements 75 form the inputs to logic gates 79, here shown as OR gates, one column of memory elements 75 per logic gate 79. The OR gate outputs 81 may form the output of the second array, or a set of programmable XOR gates 83 may receive the OR gate outputs 81 and a select signal from a nonvolatile memory bit 80 as inputs to selectively invert or not invert the signals on outputs 81. In the latter case, the XOR gate outputs 85 may form the array outputs.

Figure 4A:
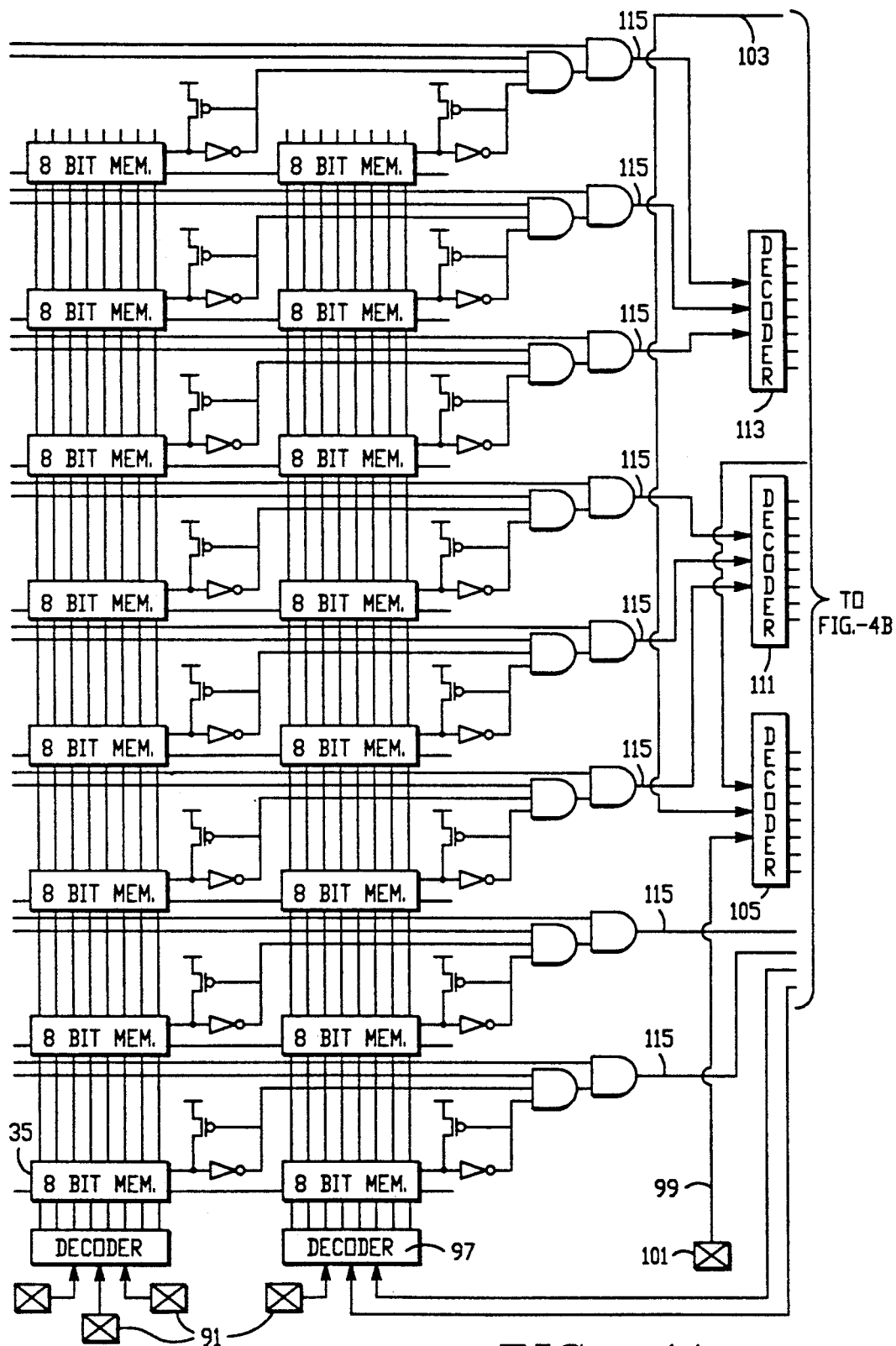
FIGS. 4a and 4b together form a schematic block diagram of a PLD of the present invention illustrating a number of optional features.
Figure 4B:
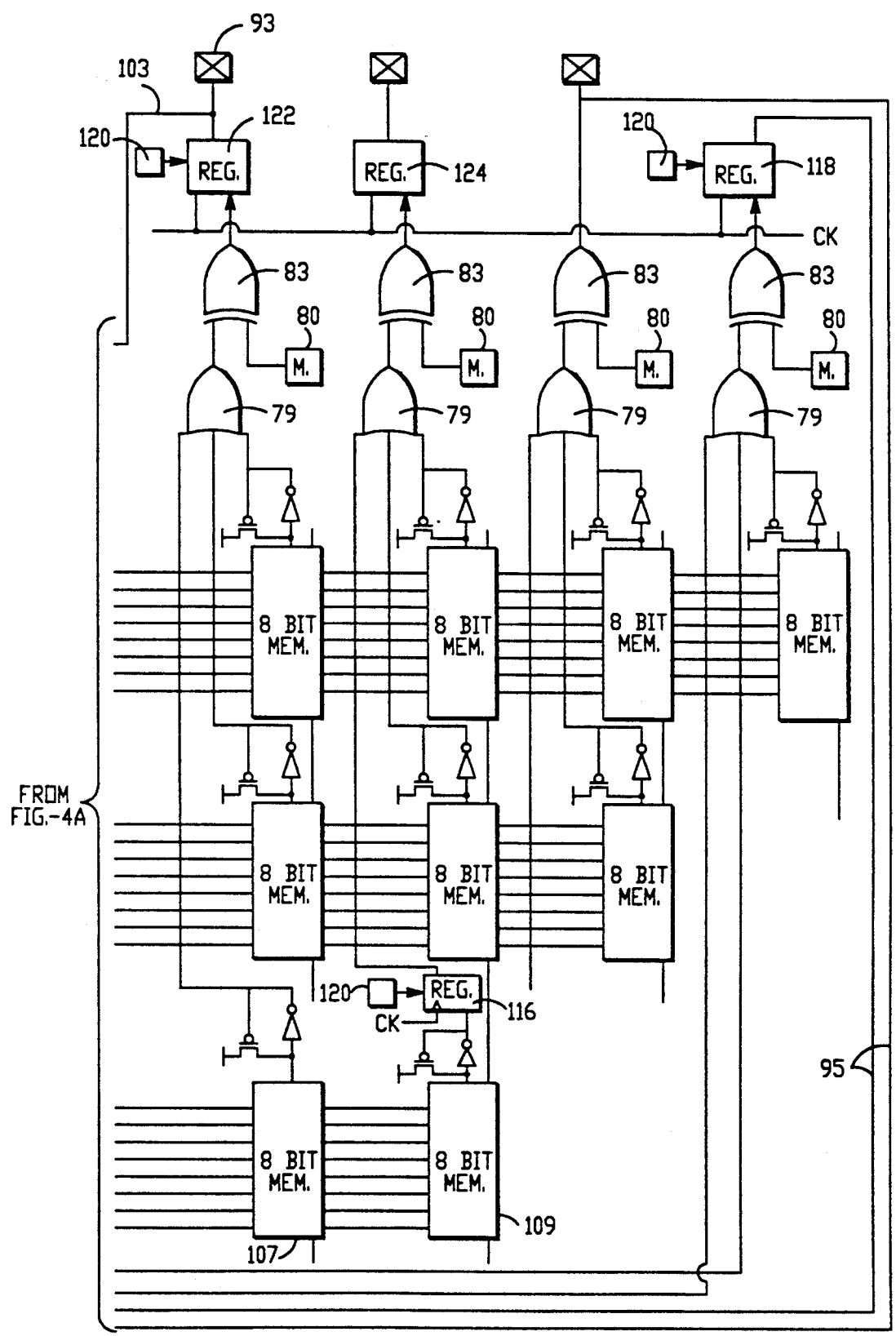

With reference to FIGS. 4a and 4b, a third programmable logic device of the invention illustrates a number of options other than those set forth in FIGS. 1-3. The inputs 91 to the first array may be external contacts of the integrated circuit device, such as pins, pads, leads or some other known form of contact. Likewise, the outputs 93 of the second array can be external contacts of the device. Alternatively, the programmable logic device may be a functional unit which is completely internal to another larger circuit, in which case some or all of the inputs and outputs of the arrays may be received from other elements within the larger circuit instead of from external contacts.

Outputs 95 of the second array can be fed back into the first array to form multilevel logic, such as arithmetic logic. In the present example, decoder 97 includes inputs that are connected to outputs 95 of the second array. If desired some inputs to the second array can be inputs 99 to the multifunction programmable logic device, that are fed directly to the second array to provide a faster pass with fewer levels of logic. As shown here, input 99 is connected to an external contact 101 of the device. Alternatively, input 99 could be received from another element in a larger integrated circuit. Outputs 103 of an array may also feed back to the inputs of the same array to form a kind of latch. For instance, as shown here, decoder 105 of the second array receives an input from an output 103 of the second array. Through memory element 107, the output 103 of the first column feeds back to an input of the same first column. Through memory element 109, the output 103 of the first column also feeds back to an input of the second column of the second array. The feedback can also be connected to some intermediate stage of the decoding tree, such as decoders 111 and 113.

The matrix of memory cells in an array need not be complete. For example, in the second array seen in FIG. 4b, decoders 105 and 111 address only two and three, respectively, of the four possible columns in the matrix.

The first array, a portion of which is seen in FIG. 4a, lacks a set of programmable XOR gates at the outputs 115 of the array. However, when the second array is programmable the lack of programmable XOR gates does not result in a loss of functional flexibility, since the XOR function can be implemented in the memory elements of the second array.

The arrays can have storage elements at their inputs and outputs. In FIG. 4b, four registers are shown by way of example. One register 116 is placed after the first level of memory 109 in the second array and three registers 118, 122 and 124 are at the output of the second array. The registers can be SR registers or D, T or JK flip-flops. They can also be replaced by latches, or the storage elements can be programmable as either registers or latches. Storage elements can also be programmable to be transparent. For example, in FIG. 4 two types of registers are shown. The first type, represented by registers 116, 118 and 122 has an associated architecture memory bit 120, such as an EPROM cell, which can be used to force those registers to be transparent, so that it can be logically removed from the data path. The second type, represented by register 124, does not have this architecture bit, so that it always functions as a register. Programming is typically independent for each register or latch, as shown here, although alternatively several registers could be programmed from a single memory bit. The registers 116, 118, 122 and 124 receive a clock input signal CK. Latches would receive an equivalent enable signal on an enable input. If there are several clocks or enable sources, the particular source received by a register or latch can be selectable by programming which of the several different clock or enable sources are to be directed toward the clock or enable input. Registers need not be placed at all possible sites. For example, FIG. 4b shows registers 118, 122 and 124 at only three of the four outputs of the second array, and registers 116 at the outputs of only one memory element 109. Alternatively, there could be registers or latches at outputs of an entire row or column of memory elements or of all memory elements. Finally, the output registers 118, 122 and 124 while commonly in the form of single bit registers, could also be multibit shift registers or memory arrays. With such multibit storage elements the same function can be formed on multiple sets of data. Alternatively, different functions can be interleaved in time on the same or different sets of data, as described before. The multibit storage elements can also be forced to be transparent by architecture memory bits 120, if desired.

With reference to FIG. 8, the memory elements can have multiple selectable behaviors by forming each memory element from two or more multibit memories 117 and 119. Both memories 117 and 119 receive common address inputs 121. Each memory 117 and 119 has a separate write bit line input 123 and 125 so that they can be loaded with different data bits, and each has a separate read bit line output 127 and 129. Selection of the memory to be read may be done by a word select signal on a line 131 connecting to pass transistors 133 and 135 on respective read bit lines 127 and 129. The signal provided to the selected line 127 or 129 is passed to inverter 137 and then to the memory element output 139. A pull-up transistor 141 aids charging of the selected line 127 or 129. The selection signal on line 131 can be provided from the state of one or more external contacts of the device, or one or more memory cells or registers on the device. If both arrays have one or more memory elements with multiple selectable behaviors, the selection can be done either simultaneously or independently for each array.

The devices of the present invention dissipate very little power when not switching and significantly less than equivalent PLAs or PALs when switching, without a speed penalty.

I claim:

1. A programmable logic array comprising
   a set of array inputs,
   a plurality of multibit memory elements, each memory element having a plurality of address inputs and a single memory output, each multibit memory element being programmable by the loading of data bits at specified addresses therein to provide a specified data bit on its memory output in response to input signals received on its address inputs,
   means for coupling said set of array inputs to said pluralities of address inputs of said plurality of memory elements,
   a plurality of logic gates, each logic gate having a set of gate inputs and a gate output, said sets of gate inputs of said plurality of logic gates being coupled to said memory outputs of said plurality of memory elements,
   a set of array outputs, and
   means for coupling said gate outputs of said plurality of logic gates to said set of array outputs.

2. A programmable logic array comprising
   a set of array inputs, wherein said set of array inputs are arranged in groups, each group of array inputs being connected to a decoder with an equal number J of decoder inputs and up to $2^J$ decoder outputs, said decoder providing a decoded memroy address signal on a different one of said decoder outputs for each combination of input signals on said J decoder inputs,
   a plurality of memory elements, each memory element having $2^J$ address inputs and a memory output, the address inputs of each memory element being connected to the decoder outputs of one of said decoders, each memory element being programmable by the loading of data bits therein to provide a specified data bit on its memory output in response to input signals received on its address inputs,
   means for coupling said set of array inputs to said sets of address inputs of said plurality of memory elements,
   a plurality of logic gates, each logic gate having a set of gate inputs and a gate output, said sets of gate inputs of said plurality of logic gates being coupled to said memory outputs of said plurality of memory elements,
   a set of array outputs, and
   means for coupling said gate outputs of said plurality of logic gates to said set of array outputs.

3. The logic array of claim 2, wherein said memory elements are arranged in a matrix of rows and columns of memory elements, each decoder being assigned a row with the decoder outputs of that decoder being connected to the address inputs of every memory element in that assigned row.

4. The logic array of claim 3 wherein said gate inputs of each logic gate are coupled to memory outputs from only a single column of memory elements.

5. The logic array of claim 4 wherein said logic gates include a first stage of logic gates, and a second stage of logic gates, each logic gate of said first stage being directly connected to a subset of the memory elements in a column, each logic gate of said second stage having inputs connected to the gate outputs of the logic gates of the first stage corresponding to a single column of memory elements, whereby each logic gate of the second stage is indirectly coupled to all memory elements from a corresponding single column.

6. The logic array of claim 2 wherein each decoder output consists of a write word line and a read word line, each memory element having a write word bit input for loading a data bit into a specified memory cell of said memory element in response to a decoded memory address signal corresponding to said specified memory cell being applied on said write word line connected to the corresponding address input of said memory element.

7. The logic array of claim 1 wherein said memory elements comprise nonvolatile memories.

8. The logic array of claim 1 wherein said memory elements comprise volatile memories.

9. The logic array of claim 8 wherein data bits for loading into said volatile memories are available from an on-chip nonvolatile memory source.

10. The logic array of claim 8 wherein data bits for loading into said volatile memories are receivable from external contacts of the logic array.

11. The logic array of claim 8 wherein data bits for loading into said volatile memories are selectable from a plurality of sources.

12. The logic array of claim 1 wherein said logic gates are selected from the group consisting of AND, OR, NAND NOR, XOR and XNOR gates.

13. The logic array of claim 1 wherein said means for coupling said gate outputs includes a set of programmable XOR gates, each XOR gate having an input connected to a gate output of said plurality of logic gates and a second input connected to a programmable memory bit.

14. A programmable logic array comprising
a set of array inputs,
a plurality of memory elements, each memory element having a set of address inputs and a memory output, each memory element being programmable by the loading of data bits therein to provide a specified data bit on its memory output in response to input signals received on its address inputs,
means for coupling said set of array inputs to said sets of address inputs of said plurality of memory elements,
a plurality of logic gates, each logic gate having a set of gate inputs and a gate output, said sets of gate inputs of said plurality of logic gates being coupled to said memory outputs of said plurality of memory elements,
a set of array outputs, and
means for coupling said gate outputs of said plurality of logic gates to said set of array outputs.

15. The logic array of claim 14 wherein said at least one storage element is of a type selected from the group consisting of a register and a latch.

16. The logic array of claim 15 wherein said at least one storage element has means for causing said storage element to be transparent, whereby said storage element is logically removable from the signal path.

17. The logic array of claim 1 wherein said means for coupling said gate outputs to said set of array outputs includes at least one storage element.

18. The logic array of claim 17 wherein said at least one storage element of a type selected from the group consisting of a register, a latch and a multibit storage element.

19. The logic array of claim 18 wherein said at least one storage element has means for causing said storage element to be transparent, whereby said storage element is logically removable from the signal path.

20. A low power, multifunction logic array device comprising,
first and second logic arrays, each array having a set of inputs and outputs, each array being operative to perform a digital logic and to provide at least one output signal on said set of outputs that is a particular function of at least one input signal received on said set of inputs, at least a subset of said set of outputs of said first array being coupled to at least a subset of said set of inputs of said second array, at least one of said arrays being programmable, wherein each said programmable array includes
(i) a plurality of multibit memory elements, each multibit memory element having a plurality of address inputs and an output, each multibit memory element being programmable by the loading of data bits at specified addresses therein to provide a specified data bit on its output in response to input signals received on its address inputs,
(ii) means for coupling said set of inputs of said programmable array to said pluralities of address inputs of said plurality of memory elements, and
(iii) a plurality of logic gates, each logic gate having a set of gate inputs and an output, said sets of inputs of said plurality of logic gates being coupled to said outputs of said plurality of memory elements, said outputs of said plurality of logic gates being coupled to said set of outputs of said programmable array.

21. The device of claim 20 wherein said first array is programmable.

22. The device of claim 21 wherein said second array is also programmable.

23. The device of claim 21 wherein said second array has a fixed function.

24. The device of claim 23 wherein said fixed function is taken from the group consisting of AND, OR, NAND and NOR, XOR and XNOR logic functions.

25. The device of claim 20 wherein said programmable array is capable of performing only a limited range of logic functions.

26. The device of claim 25 wherein said range of logic functions is restricted to the group consisting of AND, OR, NAND, NOR, XOR and XNOR logic functions.

27. A low power, multifunction logic array device comprising,
first and second logic arrays, each array having a set of inputs and outputs, each array being operative to perform a digital logic and to provide at least one output signal on said set of outputs that is a particular function of at least one input signal received on said set of inputs, at least a subset of said set of outputs of said first array being coupled to at least a subset of said set of inputs of said second array, at least one of said arrays being programmable, wherein each said programmable array includes
(i) a plurality of multibit memory elements, each memory element having a set of address inputs and an output, each memory element being programmable by the loading of data bits therein to provide a specified data bit on its output in response to input signals received on its address inputs,
(ii) means for coupling said set of inputs of said programmable array to said sets of inputs of said plurality of memory elements, wherein said means for coupling includes a set of decoders, each decoder having N inputs coupled to N corresponding inputs of said programmable array and having at most $2^N$ outputs coupled to address inputs of at least one memory element, each decoder providing a decoded address signal on at least one of its outputs in response to input signals on its inputs, and
(iii) a plurality of logic gates, each logic gate having a set of gate inputs and an output, said sets of inputs of said plurality of logic gates being coupled to said outputs of said plurality of memory elements, said outputs of said plurality of logic gates being coupled to said set of outputs of said programmable array.

28. The device of claim 20 wherein at least one of said inputs to said first array is connected to an external contact of the device.

29. A low power, multifunction logic array device comprising,
first and second logic arrays, each array having a set of inputs and outputs, each array being operative to perform a digital logic and to provide at least one output signal on said set of outputs that is a particular function of at least one input signal received on said set of inputs, at least a subset of said set of outputs of said first array being coupled to at least a subset of said set of inputs of said second array, at least one of said inputs to said second array being connected to an external contact of the device, at least one of said arrays being programmable, wherein each said programmable array includes (i) a plurality of memory elements, each memory element having a set of address inputs and an output, each memory element being programmable by the loading of data bits therein to provide a specified data bit on its output in response to input signals received on its address inputs, (ii) means for coupling said set of inputs of said programmable array to said sets of inputs of said plurality of memory elements, and (iii) a plurality of logic gates, each logic gate having a set of gate inputs and an output, said sets of inputs of said plurality of logic gates being coupled to said outputs of said plurality of memory elements, said outputs of said plurality of logic gates being coupled to said set of outputs of said programmable array.

30. A low power, multifunction logic array device comprising, first and second logic arrays, each array having a set of inputs and outputs, each array being operative to perform a digital logic and to provide at least one output signal on said set of outputs that is a particular function of at least one input signal received on said set of inputs, at least a subset of said set of outputs of said first array being coupled to at least a subset of said set of inputs of said second array, at least one of said inputs to said first array being connected to an output of said second array, at least one of said arrays being programmable, wherein each said programmable array includes (i) a plurality of memory elements, each memory element having a set of address inputs and an output, each memory element being programmable by the loading of data bits therein to provide a specified data bit on its output in response to input signals received on its address inputs, (ii) means for coupling said set of inputs of said programmable array to said sets of inputs of said plurality of memory elements, and (iii) a plurality of logic gates, each logic gate having a set of gate inputs and an output, said sets of inputs of said plurality of logic gates being coupled to said outputs of said plurality of memory elements, said outputs of said plurality of logic gates being coupled to said set of outputs of said programmable array.

31. A low power, multifunction logic array device comprising, first and second logic arrays, each array having a set of inputs and outputs, each array being operative to perform a digital logic and to provide at least one output signal on said set of outputs that is a particular function of at least one input signal received on said set of inputs, at least a subset of said set of outputs of said first array being coupled to at least a subset of said set of inputs of said second array, at least one of said arrays inputs to said second array is connected to an output of said second array, at least one of said arrays being programmable, wherein each said programmable array includes (i) a plurality of memory elements, each memory element having a set of address inputs and an output, each memory element being programmable by the loading of data bits therein to provide a specified data bit on its output in response to input signals received on its address inputs, (ii) means for coupling said set of inputs of said programmable array to said sets of address inputs of said plurality of memory elements, and (iii) a plurality of logic gates, each logic gate having a set of gate inputs and an output, said sets of inputs of said plurality of logic gates being coupled to said outputs of said plurality of memory elements, said outputs of said plurality of logic gates being coupled to said set of outputs of said programmable array.

32. A low power, multifunction logic array device comprising, first and second logic arrays, each array having a set of inputs and outputs, each array being operative to perform a digital logic and to provide at least one output signal on said set of outputs that is a particular function of at least one input signal received on said set of inputs, at least a subset of said set of outputs of said first array being coupled to at least a subset of said set of inputs of said second array, at least one of said arrays being programmable, wherein each said programmable array includes (i) a plurality of memory elements, each memory element having a set of address inputs and an output, each memory element being programmable by the loading of data bits therein to provide a specified data bit on its output in response to input signals received on its address inputs, (ii) means for coupling said set of inputs of said programmable array to said sets of address inputs of said plurality of memory elements, and (iii) a plurality of logic gates, each logic gate having a set of gate inputs and an output, said sets of inputs of said plurality of logic gates being coupled to said outputs of said plurality of memory elements, said outputs of said plurality of logic gates being coupled to said set of outputs of said programmable array, wherein at least one memory element of one of said arrays has multiple selectable outputs.

33. A low power, multifunction logic array device comprising, first and second logic arrays, each array having a set of inputs and outputs, each array being operative to perform a digital logic and to provide at least one output signal on said set of outputs that is a particular function of at least one input signal received on said set of inputs, at least a subset of said set of outputs of said first array being coupled to at least a subset of said set of inputs of said second array, at least one of said arrays being programmable, wherein each said programmable array includes (i) a plurality of memory elements, each memory element having a set of address inputs and an output, each memory element being programmable by the loading of data bits therein to provide a specified data bit on its output in response to input signals received on its address inputs, (ii) means for coupling said set of inputs of said programmable array to said sets of address inputs of said plurality of memory elements, and (iii) a plurality of logic gates, each logic gate having a set of gate inputs and an output, said sets of inputs of said plurality of logic gates being coupled to said outputs of said plurality of memory elements, said outputs of said plurality of logic gates being coupled to said set of outputs of said programmable array, wherein at least one programmable array also includes at least one storage element connected between an output of a memory element in that programmable array and an input of a logic gate in that same programmable array.

34. The device of claim 33 wherein said at least one storage element is of a type selected from the group consisting of a register and a latch.

35. The device of claim 34 wherein said at least one storage element has means for causing said storage element to be transparent, whereby said storage element is logically removable from the signal path.

36. The device of claim 20 wherein said output of at least one logic gate of at least one logic array is coupled to said set of outputs of that logic array through a storage element.

37. The device of claim 36 wherein said storage element is of a type selected from the group consisting of a register, a latch and a multibit storage element.

38. The device of claim 37 wherein said storage element has means for causing said storage element to be transparent, whereby said storage element is logically removable from the signal path.

* * * * *

UNITED STATES PATENT AND TRADEMARK OFFICE
CERTIFICATE OF CORRECTION

PATENT NO. : 5,250,859

DATED : October 5, 1993

INVENTOR(S) : Cecil H. Kaplinsky

It is certified that error appears in the above-indentified patent and that said Letters Patent is hereby corrected as shown below:

Column 1, line 40, "low (AC power) AC power is used," should read - - low (AC power). AC power is used, - -.

Column 1, line 45, "level Power used" should read - - level. Power used - -.

Column 1, line 48, "clock frequency In conventional AND" should read - - clock frequency. In conventional AND - -.

Column 3, line 65, "35 The write bit line" should read - - 35. The write bit line - -.

Column 5, line 3, "input The out-" should read - - input. The out- - -.

Claim 2, column 7, line 67, "memroy" should read - - memory - -.

Claim 14, column 9, insert missing subparagraph before the second to the last subparagraph):
- - at least one storage element connected between a memory output of a memory element and a gate input of a logic gate, - -.

Claim 18, column 9, line 35, "one storage element of a type" should read - - one storage element is of a type - -.

Claim 20, column 9, line 46, "perform a digital logic" should read - - perform digital logic - -.

UNITED STATES PATENT AND TRADEMARK OFFICE
CERTIFICATE OF CORRECTION

PATENT NO. : 5,250,859
DATED : October 5, 1993
INVENTOR(S) : Cecil H. Kaplinsky

It is certified that error appears in the above-indentified patent and that said Letters Patent is hereby corrected as shown below:

Claim 27, column 10, line 22, "perform a digital logic" should read - - perform digital logic - -.

Claim 27, column 10, line 30, "of multibit memory elements" should read - - of memory elements - -.

Claim 27, column 10, line 38, "sets of inputs" should read - - sets of address inputs - -.

Claim 27, column 10, line 49, "set of gate inputs" should read - - set of inputs - -.

Claim 29, column 10, line 62, "perform a digital logic" should read - - perform digital logic - -.

Claim 29, column 11, line 11, "sets of inputs" should read - - sets of address inputs - -.

Claim 29, column 11, line 14, "set of gate inputs" should read - - set of inputs - -.

Claim 30, column 11, line 24, "perform a digital logic" should read - - perform digital logic - -.

Claim 30, column 11, line 41, "programmable array to said sets of inputs" should read - - programmable array to said sets of address inputs - -.

Claim 30, column 11, line 44, "a set of gate inputs" should read - - a set of inputs - -.

UNITED STATES PATENT AND TRADEMARK OFFICE
CERTIFICATE OF CORRECTION

PATENT NO. : 5,250,859
DATED : October 5, 1993
INVENTOR(S) : Cecil H. Kaplinsky

It is certified that error appears in the above-indentified patent and that said Letters Patent is hereby corrected as shown below:

Claim 31, column 11, line 55, "perform a digital logic" should read -- perform digital logic --.

Claim 31, column 11, line 61, "said arrays inputs" should read -- said inputs --.

Claim 31, column 12, line 7, "a set of gate inputs" should read -- a set of inputs --.

Claim 32, column 12, line 17, "perform a digital logic" should read -- perform digital logic --.

Claim 33, column 12, line 47, "perform a digital logic" should read -- perform digital logic --.

Signed and Sealed this

Twelfth Day of April, 1994

Attest:

BRUCE LEHMAN

*Attesting Officer*  *Commissioner of Patents and Trademarks*